United States Patent [19]

Bruce et al.

[11] Patent Number: 4,978,594
[45] Date of Patent: Dec. 18, 1990

[54] FLUORINE-CONTAINING BASE LAYER FOR MULTI-LAYER RESIST PROCESSES

[75] Inventors: James A. Bruce, Essex Junction; Michael L. Kerbaugh, Burlington, both of Vt.; Ranee W. Kwong, Wappinger Falls; Tanya N. Lee, Underhill, both of N.Y.; Harold G. Linde, Richmond, Vt.; Harbans S. Sachdev, Wappinger Falls, N.Y.

[73] Assignee: International Business Machines Corporation, Armonk, N.Y.

[21] Appl. No.: 258,530

[22] Filed: Oct. 17, 1988

[51] Int. Cl.$^5$ .............................. G03F 7/26
[52] U.S. Cl. ........................ 430/14; 430/17; 430/18; 430/323; 430/325
[58] Field of Search ............... 430/312, 313, 314, 317, 430/323, 14, 17, 18, 325

[56] References Cited

U.S. PATENT DOCUMENTS

| 4,243,476 | 1/1981 | Ahn et al. | 156/643 |
| 4,357,203 | 11/1982 | Zelez | 156/643 |
| 4,396,479 | 8/1983 | Jones | 204/192 |
| 4,456,501 | 6/1984 | Bayman et al. | 156/643 |
| 4,501,061 | 2/1985 | Wonnacott | 29/591 |
| 4,529,474 | 7/1985 | Fujiyama | 156/643 |
| 4,547,261 | 10/1985 | Maa et al. | 156/643 |
| 4,552,833 | 11/1985 | Ito et al. | 430/325 |
| 4,599,243 | 7/1986 | Sachdev et al. | 427/38 |
| 4,613,400 | 9/1986 | Tam et al. | 156/643 |

FOREIGN PATENT DOCUMENTS

| 274757 | 7/1988 | European Pat. Off. | 430/313 |
| 2154330 | 9/1985 | United Kingdom | 430/313 |

OTHER PUBLICATIONS

Dobkin et al., "Plasma Formation of Buffer Layers for Multilayer Resist Structures", IEEE Electron Device Letters vol. EDL2, No. 9, Sep. 1981, pp. 222–224.
Lyman et al., "Lift-Off of Thick Metal Layers Using Multilayer Resist", J. Vac. Sci. Technol., 19(4), Nov./Dec. 1981, pp. 1325–1328.

Primary Examiner—Jose G. Dees
Attorney, Agent, or Firm—Calfee, Halter & Griswold

[57] ABSTRACT

A process for forming a pattern on a substrate utilizing photolithographic techniques. In this process a layer of polymeric material containing a fluorine-containing compound is applied over the substrate and cured. A layer of photoresist material is applied over the polymeric material imagewise exposed and developed to reveal the image on the underlying polymeric material. Thereafter, the photoresist is silylated, and the structure is reactive ion etched to transfer the pattern to the underlying substrate. The fluorine component provides an underlying structure free of residue and cracking.

13 Claims, 1 Drawing Sheet

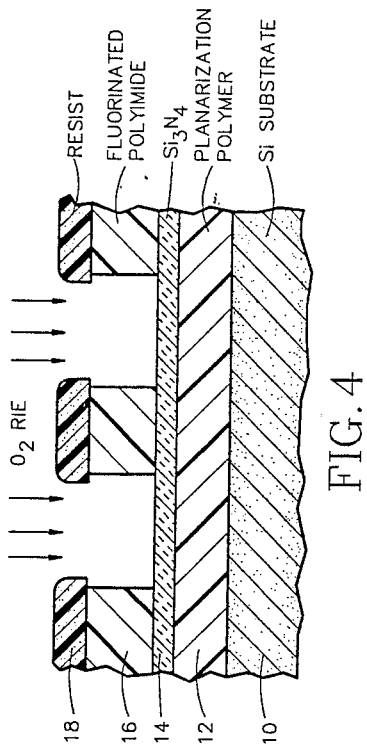
FIG.1
FIG.2
FIG.3
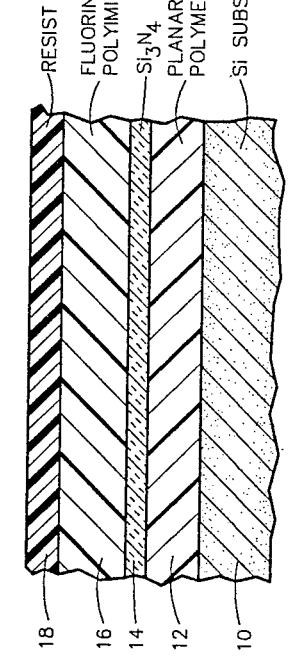
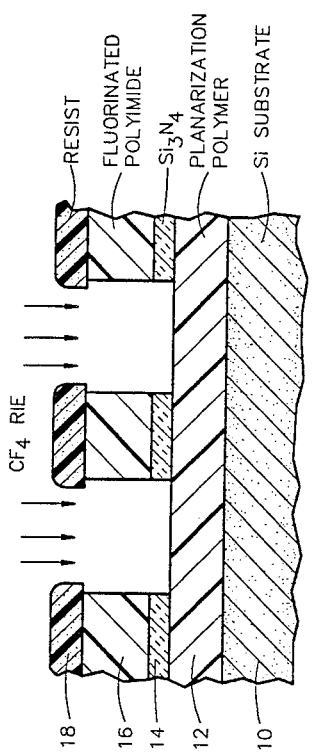
FIG.4
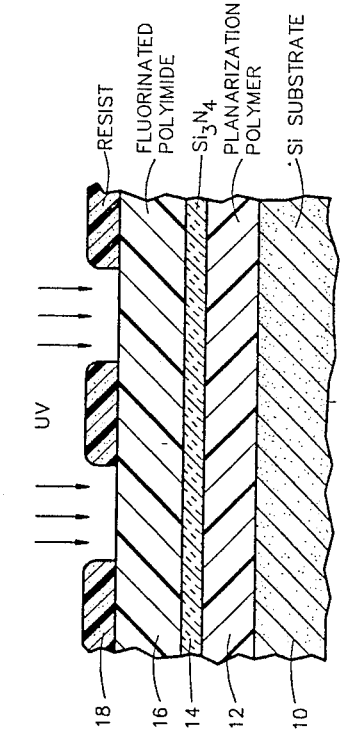
FIG.5

FLUORINE-CONTAINING BASE LAYER FOR MULTI-LAYER RESIST PROCESSES

BACKGROUND OF THE INVENTION

This invention relates generally to the fabrication of semiconductor components such as integrated circuits and wiring, and more particularly to an improvement in the polymer underlayer for MLR processes for definition of interconnection metallurgy. In more particular aspects it relates to pattern delineation on a substrate by simplified processes as a bi-layer structure utilizing a silylated or silicon-containing photoresist material overlying a polymeric coating on the substrate which polymeric coating has fluorine-containing segments in the polymer structural network.

A process simplification technique which offers a great deal of advantage over standard MLR process in fabrication of integrated circuits both in high density semiconductor and packaging technologies is one in which the photoresist mask is rendered $O_2$ resistant by treatment with an organo-silicon reagent in solution or in vapor phase after resist patterning by standard process. The silylated resist mask is then used to pattern an underlying polymeric coating, which coating overlies the substrate by $O_2$ plasma treatment as reactive ion etching. By using the silylation approach, a relatively thinner resist layer can be employed without the need of a separate mask layer since the silylated resist layer functions as an effective mask during $O_2$ reactive ion etching ($O_2$ RIE) of the underlying polymeric material to pattern-wise expose the substrate for subsequent deposition of interconnection metallurgy by lift-off. By using a thinner photoresist material a better and finer pattern definition can be obtained on the underlying polymeric material. Alternatively, process simplification can be provided by utilizing a silicon-containing radiation sensitive polymer layer as an $O_2$ RIE resistant-imaging layer on the polymer underlayer. In this case, the pattern is defined in the top layer by standard lithographic techniques and then the resist pattern is replicated in the underlayer by $O_2$ RIE when the silicon-containing layer functions as a mask. Such silylation techniques are known and described in U.S. Pat. No. 4,552,833; and U.S. patent application Ser. No. 720,781; U.S. patent application Ser. No. 713,370; U.S. patent application Ser. No. 713,509.

In the silylation process using the solution technique, the entire stack is immersed in the solution of the silylating reagent in a solvent which is selected such that a homogeneous solution of the organosilane is formed but none of the polymer film is eroded during silylation. For practical utility of this technique to provide necessary incorporation of the silicon moiety in the resin matrix, the resist layer must comprise a polymer phase having residual reactive functionality such as in the case phenolic resins (or novolac resins) and at the same time the underlying polymer must be inert and resistant to the silylation process. The conventional polyimides such as PMDA-ODA (pyromellitic dianhydride-oxydianiline), or Pyralin PI2540 available from E.I. duPont de Nemours Co. (hereinafter duPont) are found not suitable because these invariably lead to formation of non-removable RIE residue and also cannot be used for lift-off due to insolubility in common solvents after the polymers are cured to high temperature. On the other hand, use of soluble polyimides such as XU-218 of Ciba-Geigy is limited to thin films (less than 2-3u) since at greater thickness these films undergo cracking and crazing under silylation conditions involving solvent immersion processes.

Also the $O_2$ reactive ion etching of these and other conventional prior art polymers as polysulfones of ICI Industries results in the formation of nonremovable RIE residues. With the use of solution silylation process, there has been the problem of RIE residues which could not be removed even after 50% to 70% over-etching. While this may take several forms, one resulting condition is known as "grass" formation. This is characterized by an unevenly etched polymer wherein there are thin stems of polymer extending upwardly from the otherwise exposed surface of the substrate beneath the etched polymer, giving it an appearance of "grass" growing from the surface of the substrate. Particles of silicon, embedded in these thin stems, appear to be the cause of this as well as other similar types of conditions wherein the surface has not been completely cleaned.

Such residues are undesirable as these interfere with substrate metal and/or metal-to-metal contacts in subsequent metallization steps resulting in multitude of problems including contact resistance and metal adhesion.

SUMMARY OF THE INVENTION

According to the present invention, a technique is provided to obtain residue-free, uniform, crack-free pattern through an underlying polymer film onto a substrate by $O_2$ reactive-ion-etching the polymer utilizing an imaged resist silylation approach to generate an etch mask. This technique utilizes a fluorine-containing polymer underlayer in conjunction with a resist-layer comprising a phenolic or novolac resin and a radiation sensitive compound such as naphthoquinone-diazide-sulfonate esters (U.S. Pat. No. 3,661,582). AZ1350J is a typical example of a conventional positive photoresist based on phenolic resin (novolak) and naphthoquinone-1, 2-diazide-5-sulfonate ester. By utilizing a fluorine-containing polymer underlayer, a clean image transfer, free of "grass" and other residues, is achieved after etch without any problem of cracking or degradation of mechanical properties of the polymer layer.

DESCRIPTION OF THE DRAWINGS

FIGS. 1 through 5 are diagrammatic cross-sectional representations of various steps in the process of the present invention.

DESCRIPTION OF THE PREFERRED EMBODIMENTS

According to the present invention, an improved technique for forming and transferring an image to an underlying structure is provided. FIGS. 1 through 5 show broadly the invention, in one of its embodiments as it relates to the fabrication of multi-level metal structures using polymer insulation with additional passivating layers of $Si_3N_4$. FIG. 1 shows a silicon wafer 10 prepared in a conventional manner with a planarizing polymer coating 12 thereon and a silicon nitride etch-stop layer 14 formed on top of the layer 12. The polymer of layer 12 preferably is a polyimide derived from PMDA-ODA which is available from duPont under the trade name Pyralin, and the silicon nitride layer can be plasma deposited according to standard techniques, for example, plasma enhanced chemical vapor deposition (PECVD) as described in U.S. Pat. No. 4,367,119 "Planar Multi-Level Metal Process with Built-In Etch Stop," Jan. 4, 1983, J. S. Logan et al. The silicon substrate and its preparation are well known in the art, and do not form a part of the invention per se, as other substrates and/or layers thereon can also be utilized.

As shown in FIG. 2, a layer of a fluorine containing polymer e.g. a fluorinated polyimide 16 is applied over silicon nitride layer 14, and cured. In some instances, this fluorinated polymer layer 16 may perform the function of the planarizing layer 12, in which case it (the polymer layer 16) is applied directly on the substrate 10 and the layers 12 and 14 are omitted. On top of the fluorine containing polymer 16 a layer of photoresist material is applied. Any of the conventional photoresists as those based on two component systems comprising photoactive compound and novolak resins or polyvinylphenol type of resins can be employed. Typical examples of positive type photoresist compositions of the two component category are AZ type formulations which contain quinone diazide type photosensitizers in novolak resins. Another category of highly sensitive positive working resin formulations are polyolefin sulfone-novolak based compositions. As can be seen in FIG. 3, the photoresist 18 is imagewise exposed to radiation of the proper wave length, e.g. U.V., to form the desired image in the photoresist and the photoresist is developed to remove the exposed portion and expose or reveal the underlying fluorinated polyimide. Typical organosilicon monomers that can be used for the silylation of patterned photoresist layer are:

N,N-Diethylaminotrimethylsilane
Hexamethyldisilazane
1,1,3,3, - Tetramethyldisilazane
Hexamethylcyclotrisilazane
Dimethyldichlorosilane
Divinyltetramethyldisilazane
Trimethyltrivinylcyclotrisilazane These can be dissolved in organic solvents up to 5–20 weight percent to form a silylation solution. Organic solvents are to be selected such that during silylation at 20°–65° C. for 5–30 minutes no damage is caused to the fluorine-containing underlayer or the photoresist film. Typical solvents found compatible with the fluorine-containing underlayer of this invention are benzene, toluene, xylene, hexane, pentane, or mixtures thereof, or in combination with 1–5% of a more polar solvent such as n-methylpyrollidone, dimethylformamide, dimethylacetamide, n-propylamine, diglyme, and Γ-butyrolactone. The resulting stack is then silylated, e.g. by immersion in a solution containing 3–15% of a silylating agent such as functionalized silane in a non-polar solvent which will cause incorporation of organosilicon segments by reaction with active sites on the photoresist components converting the patterned photoresist to an effective mask for transfer of pattern into the underlayer by $O_2$ reactive ion etching. The $O_2$ reactive ion etching is then performed as shown in FIG. 4 to etch away the exposed region of the fluorine containing polyimide.

The distinguishing feature of the fluorine-containing polymer underlayer is that it results in residue-free or "grass"-free and crack-free RIE etch patterns which is a unique advantage over standard polyimide underlayers such as ICI polysulfone and Ciba-Geigy Probimide XU-284 etc. According to this invention, the preferred fluorine-containing polymers are polyimides derived from Hexafluoroisopropylidene ($-C(CF_3)_2$) group containing dianhydrides and/or diamines as shown below (structures of fully imidized polymers):

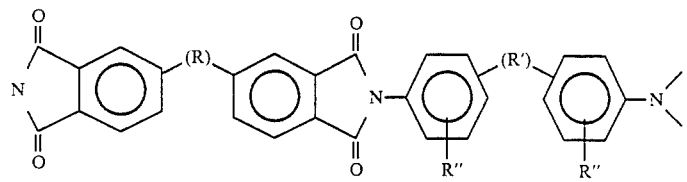

wherein:
R = $-C(CF_3)_2$, $(CF_2)_{1-6}$, O, S, $SO_2$, CO
R' = $C(CF_3)_2$, $(CF_2)_{1-6}$, O, S, $SO_2$, CO
R" = $CF_3$, H A specific material of this class is derived from 2,2-bis(3,4-dicarboxyphenyl) hexafluoropropanedianhydride (6-FDA) and oxydianiline (ODA) as shown below:

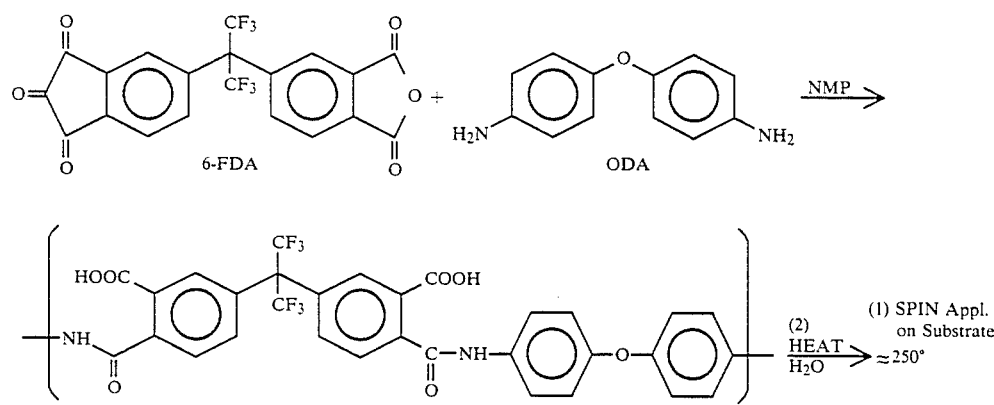

Polyamic Acid in NMP Solution

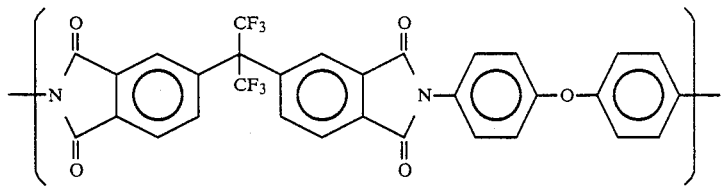

Fully Imidized Polymer

The polyamic acid formulation is available commercially under the trade name RC2566 from duPont as about 15-20% solids as solution in NMP with 10-20% hydrocarbon solvent. DuPont resin NR 150 which is a related fluorine-containing polyimide can also be used.

With respect to RC2566 and related 6F-containing polymers as underlayers, it was found that unlike non-fluorine containing polymides such as PMDA-ODA or BTDA-ODA, the 200°-250° cured films of 6-FDA derived polymides remained soluble in NMP and thus could be used for lift-off applications in multi-layer metal and multi-layer resist processes. These films develop solvent resistance after curing above 300° C. Thus, the fluorine-containing polyimides, typically RC2566 and related materials, are found superior for general applications as an underlayer. Significant advantages discovered are:

(1) Residue-free or "grass" free pattern transfer by $O_2$RIE in a bi-layer resist process involving post-develop silylation step.

(2) Residue-free or "grass" free pattern transfer by $O_2$RIE in a trilayer process using spin-on RIE barrier over the underlayer and resist-layer, as standard MLR processes.

(3) No problem of cracking of underlayer up to 12 micron thickness during any of the processing steps involving silylation, $O_2$RIE and lift-off in solvents such as NMP.

(4) General application as an underlayer with improved performance in metal lift-off, ion implant pattern transfer and other fabrication sequences.

If a silicon nitride or an alternative inorganic, organometallic or organic dual passivating layer is employed underneath, this can then be removed by conventional $CF_4$ or $CF_4$ plus $O_2$ reactive ion etching as shown in FIG. 5 followed by metallization by sputtering or evaporation and subsequent lift-off in NMP to provide clean, well defined, well adhering, good quality metallization pattern.

EXAMPLE 1

Clean silicon wafers were surface treated with 0.1% Γ-aminopropyltriethoxysilane coupling agent in water or in ethanol-water mixture followed by spin application of PMDA-ODA derived polyamic acid available from duPont as a planarization coating and subjected to cure/bake cycle involving 15 minutes at 85° C./ followed by 25 minutes at 200° C., then 30 minutes at 300° C. and finally for 40 minutes at 400° C. in inert atmosphere. This provides a coating with a final thickness of 5.5 microns. A silicon nitride layer about 2.5KÅ thick was plasma deposited after which the substrates were heated to 200° C. for 10 minutes and then again primed with a 0.1% solution of Γ-aminopropyltriethoxysilane in water or in ethanol $H_2O$ mixture.

A commercial formulation of a fluorine-containing polymer RC2566 available from duPont, was obtained as 20% solids in N-methylpyrrolidone (NMP) and was spin applied to the primed substrate and subjected to a bake cycle of 85° C. for 25 minutes, 150° C. for 20 minutes and 230° C. for 30 minutes to form 3-4 micron thick films. For thicker films (8-10 microns) the first coat can be baked only to 150° and a second coat of the dilute polymer RC2566 was applied followed by the bake cycle involving 85° C. for 25 minutes, 25 minutes at 200° C. and finally 30 minutes at 230° C. to yield a layer 8 microns thick. Using high molecular weights RC2566 formulation, 8-10 microns thick coatings can be formed in a single coat.

For a thicker underlayer, e.g. 10-12 microns, which is required in certain packaging applications, either high viscosity material can be used to form thick films in a single coat or multiple coatings of lower viscosity material using 130°-150° C. cure in-between the coats.

Once the desired thickness of the underlayer was formed after the 230°-250° C. bake/cure cycle, a conventional positive photoresist formulation, Shipley Company 1450B was spin applied at 3000 RPM for 30-45 seconds, and baked at 85° C. for 30 minutes to form about 0.8 micron thick resist layer. The resist was then imagewise exposed to mid UV for 22-25 seconds. The exposed image was then immersion developed in 1:4.5 AZ developer (supplied by Shipley Corp.) and rinsed thoroughly with deionized water and baked for 10 minutes at 85°.

The patterned resist was silylated by immersion in a 10% solution of hexamethylcyclotrisilazane (HMCTS) in xylene with 1% NMP at 28°-42° for 15 minutes and rinsed with xylene. Alternatively, the patterned resist can be silylated by immersion into a 6% solution of divinyltetramethyldisilazane and Γ-aminopropyltriethoxysilane (10:1) in xylene for 15 minutes at 35°. The silylation is followed by $O_2$ RIE process to transfer the pattern into the fluorine-containing polyimide underlayer. This can be performed on a GCA reactive ion etching tool at 300 watts and 31 microns pressure with about 28 sccm $O_2$ using the silylated resist layer as the etch mask, etch rate of RC2566 polyimide 1700Å/minutes. Generally, the process involves about 50% to 70% overetch to assure adequate overhand when lift-off profile is desired. At this stage, no cracking or other damage occurs to the polyimide coating, and the resulting image is clean, and free of "grass" or other residues. The silicon nitride can be etched by a conventional $CF_4$ reactive ion etching. If desired, a post etching step of cleaning in buffered HF dip and deionized water rinse can be employed which will also remove the remaining silylated photoresist.

Subsequent blanket evaporation of Al/Cu or

Cu followed by removal of the lift-off stencil by 10 standard soak in NMP at 70°-85° C. for 1-2 hours gave excellent quality metal patterns.

EXAMPLE II

A silicon wafer was primed with 0.1% solution of Γ-aminopropyltriethoxy silane as an adhesion promoter. A fluorine-containing polymer formulation, RC2566 (duPont) was then spin applied and baked at 220° C. for 30 minutes to form 1.2 microns thick film. A conventional positive photoresist AZ1350J based on novolak resin with quinone-diazide photosensitizer was applied at a thickness of about 0.8 microns and baked at 85° C. for 30 minutes. The resist was pattern-wise exposed to near UV (365nm) radiation and post baked at 95° C. for 5 minutes. The exposed resist was developed in 0.17N KOH and rinsed in deionized water. Following this, silylation was performed in 10% hexamethylcyclotrisilazane (HMCTS) and 90% xylene at 55° C. for 15 minutes, and rinsed in xylene, and dried with nitrogen gas flow. Reactive ion etching was then performed on a Model 8100 etcher manufactured by Applied Materials Co. at a power of 800 watts, a pressure of 8mTorr, and oxygen flow of 31 sccm and an argon flow of 13 sccm. The underlying material is then etched. This was followed by a stripping operation in N-methylprroli-done at 70° followed by a final cleaning in a mixture of concentrated sulfuric/nitric acid with subsequent rinse. The result was a substrate in the etched areas free of any residual polymer and particularly free of "grass"-like residue.

EXAMPLE III

In this case an RC2566 underlayer in conjunction with polyolefin sulfone-novolak based resin was utilized. The resist was patterned by e-beam exposure (5uc/cm$^2$) and rinsed in an aqueous base. Silylation was carried out in 5% solution of HMCTS in xylene at 55° C. for 5 minutes and then the pattern was transferred into the underlayer by O$_2$RIE, treated with buffered HF for 15 seconds, followed by a DI water rinse.

This process has been used on other substrates, such as silicon oxide, polysilicon, and even metals such as tungsten.

The reason that the fluorine containing polyimide is so effective as an underlayer polymer in a process where silylation is used is not completely understood. However, it is believed that it is a result of several interrelated phenomena and mechanisms. First it should be noted that silylation of the resist involves reaction of the silylating reagent with active sites such as free hydroxyl groups (—OH) on the resist polymer matrix such as novolak to provide a silicon containing patterned resin layer which will be resistant to O$_2$ reactive ion etching. In a similar manner, if there are any active sites in the underlaying polymer layer, the organo-silicon reagents will react at these sites, causing incorporation of a silicon in the underlying polymer which may result in RIE residues in O$_2$RIE etching process. It is possible that the fluorine-containing polyimides provide fewer accessible sites than conventional polyimides. However, even if during silylation or during the subsequent etching some silicon moiety gets incorporated in the polyimide layer, the presence of the fluorine provides a reactant (to form a gas) that will etch away the silicon that is a part of or contained in the polyimide. However, the fluorine being a part of the polyimide film structure is localized and does not create sufficient fluorine in the atmosphere generally to adversely affect the functioning of the silylated resist material as an etch mask; neither does it affect the etch characteristics e.g. increasing the isotropic etch component. Nevertheless, whatever mechanism or mechanisms are involved, fluorine-containing polyimides have been found to provide unique performance advantages as described in this invention.

It should also be understood that the examples above are merely illustrations of different embodiments of the invention and that the invention is not limited to the specific steps and materials enumerated. For example, other silylation techniques and agents can also be used. For example, other solution silylating agents such as described in Chemical Abstracts, Vol. 104, 43197, R. Morgan, and U.S. Pat. No. 4,552,833, can be used. Also, Vapor Silylation, such as described in U.K. Patent No. 2,154,330, published Sept. 4, 1985, can be practiced.

The particular technique will depend upon the resist type. If a positive resist is utilized, such as AZ or polyolefin sulfone-novolak types, the exposed regions will undergo silylation due to relatively faster diffusion, e.g. see "A Principle of Formation of Plasma Developable Resins and Importance to Dry Development of Submicron Lithography," J. Vie, Science Technical 19(2), July 1, Aug. 1981, p. 2591. In the case of certain negative resists, the exposed regions will preferentially be silylated. The O$_2$RIE is then performed as indicated above.

While the invention has been described with some degree of particularity, numerous changes and modifications can be made without departing from the scope of the appended claims.

What is claimed is:

1. A structure suitable for deposition of a metallization pattern thereon, said structure having been formed by:

depositing a layer of polymeric material onto a substrate, said polymeric material having a fluorine-containing functional group and curing said polymeric material;

applying a layer of photoresist material over said polymeric material;

imagewise exposing and developing said photoresist material to imagewise expose said underlying polymeric material;

silylating the photoresist material remaining on the polymeric material; and reactive ion etching the underlying exposed polymeric material to transfer a pattern down to the underlying substrate utilizing the silylated resist material as an etch barrier to thereby provide a surface pattern on said substrate free of silicon embedded therein, and essentially free of any cracking in the underlying polymer layer; and wherein the structure includes a layer of photoresist material having a silicon moiety dispersed therein.

2. The invention as defined in claim 1, wherein the polymeric material is a fluorine-containing polyimide.

3. The invention as defined in claim 2, wherein the weight percent fluorine content in the polyimide repeat unit is 5–30 percent.

4. The invention as defined in claim 2, wherein the polymeric material has the structure of:

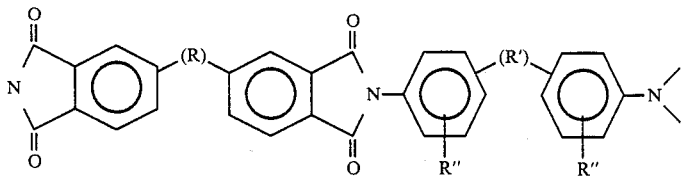

wherein:
R=—C(CF$_3$)$_2$, (CF$_2$)$_{1-6}$, O,S,SO$_2$, CO
R'=—C(CF$_3$)$_2$, (CF$_2$)$_{1-6}$, O,S,SO$_2$, CO
R''=CF$_3$, H.

5. The structure as defined in claim 1 wherein said substrate includes at least first and second layers of material, and where the first layer of material has the polymeric material deposited thereon and is subject to reactive ion etching, said process being further characterized by reactive ion etching that portion of the first layer of material underlying the polymeric material removed by reactive ion etching thereof.

6. The structure of claim 5 wherein said first layer of material is silicon nitride.

7. A process of forming a pattern on a substrate by photolithographic techniques comprising the steps of:
providing a substrate;
applying a layer of polymeric material to the substrate that includes a fluorine containing structural segment component and curing said material,
applying a layer of photoresist over said polymeric material;
imagewise exposing and developing said photoresist material to imagewise reveal said underlying polymeric material;
silylating the photoresist material remaining on said polymeric material;
and reactive ion etching the revealed underlying polymer regions to transfer pattern down to the underlying substrate utilizing the silylated photoresist as an etch barrier to thereby form a surface pattern on said substrate essentially free of any residue or cracking in the underlying polymeric layer.

8. The invention as defined in claim 5, wherein the polymeric material is fluorine-containing polyimide.

9. The invention as defined in claim 8, wherein the weight percent fluorine content in the polyimide repeat unit is 5–30 percent.

10. The invention as defined in claim 8, wherein the polymeric material has the structure of:

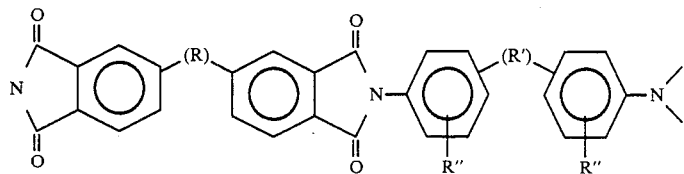

wherein:
R=—C(CF$_3$)$_2$, (CF$_2$)$_{1-6}$, O,S,SO$_2$ CO
R'=—C(CF$_3$)$_2$, (CF$_2$)$_{1-6}$, O,S, SO$_2$, CO
R''=CF$_3$, H.

11. The process as defined in claim 7, wherein said substrate includes at least first and second layers of material, and where the first layer of material has the polymeric material deposited thereon and is subject to reactive ion etching, said process being further characterized by reactive ion etching that portion of the first layer of material underlying the polymeric material removed by reactive ion etching thereof.

12. The process of claim 11 wherein said first layer of material is silicon nitride.

13. A process of forming a pattern on a substrate by photolithographic techniques comprising the steps of,
providing a substrate;
applying a layer of polymeric material to the substrate that includes a fluorine containing component and curing said material;
applying a layer of photoresist over said polymeric material;
imagewise exposing and developing said photoresist material to imagewise reveal said underlying polymeric material;
silylating the photoresist material remaining on said polymeric material;
and reactive ion etching the revealed underlying polymer regions to transfer pattern down to the underlying substrate utilizing the silylated photoresist as an etch barrier to thereby form a surface pattern on said substrate essentially free of any residue or cracking in the underlying polymeric layer.

* * * * *

UNITED STATES PATENT AND TRADEMARK OFFICE
CERTIFICATE OF CORRECTION

PATENT NO.   :   4,978,594

DATED        :   December 18, 1990

INVENTOR(S)  :   James A. Bruce, et al.

It is certified that error appears in the above-identified patent and that said Letters Patent is hereby corrected as shown below:

On the title page item [75] add the following inventor;

Krishna G. Sachdev, Wappingers Falls, N.Y.

Signed and Sealed this

Seventeenth Day of November, 1992

*Attest:*

DOUGLAS B. COMER

*Attesting Officer*   *Acting Commissioner of Patents and Trademarks*